United States Patent
Song et al.

(10) Patent No.: US 11,759,778 B2
(45) Date of Patent: Sep. 19, 2023

(54) ELECTRODE PLATE, MICROFLUIDIC CHIP AND METHOD OF MANUFACTURING ELECTRODE PLATE

(71) Applicant: BOE TECHNOLOGY GROUP CO., LTD., Beijing (CN)

(72) Inventors: Xiaoxin Song, Beijing (CN); Feng Zhang, Beijing (CN); Wenqu Liu, Beijing (CN); Zhijun Lv, Beijing (CN); Zhao Cui, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 506 days.

(21) Appl. No.: 16/763,838

(22) PCT Filed: Dec. 6, 2019

(86) PCT No.: PCT/CN2019/123727
§ 371 (c)(1),
(2) Date: May 13, 2020

(87) PCT Pub. No.: WO2020/143372
PCT Pub. Date: Jul. 16, 2020

(65) Prior Publication Data
US 2021/0220826 A1    Jul. 22, 2021

(30) Foreign Application Priority Data
Jan. 8, 2019  (CN) .......................... 201910016355.2

(51) Int. Cl.
*B01L 3/00* (2006.01)
*B05D 7/00* (2006.01)
*C23C 14/08* (2006.01)

(52) U.S. Cl.
CPC ..... *B01L 3/502715* (2013.01); *B01L 3/50273* (2013.01); *B01L 3/502707* (2013.01);
(Continued)

(58) Field of Classification Search
CPC ......... B01L 3/502715; B01L 3/502707; B01L 3/50273; B01L 2200/027; B01L 2200/12;
(Continued)

(56) References Cited

U.S. PATENT DOCUMENTS

| 2012/0154886 A1* | 6/2012 | Heikenfeld ....... B01L 3/502792 359/228 |
| 2014/0353171 A1 | 12/2014 | Wilson |
| 2019/0083977 A1 | 3/2019 | Seyoum et al. |

FOREIGN PATENT DOCUMENTS

| CN | 104841499 A | 8/2015 |
| CN | 104846400 A | 8/2015 |

(Continued)

OTHER PUBLICATIONS

Office Action dated Jan. 13, 2020, issued in counterpart CN Application No. 201910016355.2, with English translation (15 pages).
(Continued)

*Primary Examiner* — Christine T Mui
(74) *Attorney, Agent, or Firm* — WHDA, LLP (57) ABSTRACT

The present disclosure provides an electrode plate, a microfluidic chip, and a method of manufacturing the electrode plate. In one embodiment, an electrode plate includes: a substrate, an electrode and a surface contact layer stacked in sequence, and a droplet inlet hole passing through the substrate, the electrode and the surface contact layer. The surface contact layer comprises a super-hydrophobic region and a hydrophilic region, and the droplet inlet hole is disposed in the hydrophilic region. The microfluidic chip includes: a first electrode plate formed by the abovemen-
(Continued)

tioned electrode plate, and a second electrode plate provided on a side of the first electrode plate close to the surface contact layer. The first electrode plate is provided opposite to the second electrode plate and a liquid channel is formed between the first electrode plate and the second electrode plate.

12 Claims, 3 Drawing Sheets

(52) U.S. Cl.
CPC ..... *B01L 2200/027* (2013.01); *B01L 2200/12* (2013.01); *B01L 2300/0645* (2013.01); *B01L 2300/0816* (2013.01); *B01L 2300/165* (2013.01); *B01L 2300/166* (2013.01); *B01L 2400/022* (2013.01); *B01L 2400/088* (2013.01); *B05D 7/56* (2013.01); *C23C 14/086* (2013.01)

(58) Field of Classification Search
CPC ..... B01L 2300/0645; B01L 2300/0816; B01L 2300/165; B01L 2300/166; B01L 2400/022; B01L 2400/088; B05D 7/56

USPC ............................................ 422/503, 500, 50
See application file for complete search history.

(56) References Cited

FOREIGN PATENT DOCUMENTS

| | | |
|---|---|---|
| CN | 105833926 A | 8/2016 |
| CN | 105854964 A | 8/2016 |
| CN | 205899242 U | 1/2017 |
| CN | 108778512 A | 11/2018 |
| CN | 208302807 U | 1/2019 |
| CN | 109718878 A | 5/2019 |
| EP | 2802416 B1 | 4/2016 |
| WO | 2017/078059 A1 | 5/2017 |

OTHER PUBLICATIONS

Office Action dated Jul. 10, 2020, issued in counterpart CN Application No. 201910016355.2, with English translation (15 pages).

* cited by examiner

ELECTRODE PLATE, MICROFLUIDIC CHIP AND METHOD OF MANUFACTURING ELECTRODE PLATE

CROSS-REFERENCE TO RELATED APPLICATION

The present disclosure claims priority to Chinese Patent Application No. 201910016355.2 filed on Jan. 8, 2019 in the State Intellectual Property Office of China, the disclosure of which is hereby incorporated by reference in its entirety.

TECHNICAL FIELD

The present disclosure generally relates to the field of microfluidic chip technology, and particularly, to an electrode plate, a microfluidic chip applied with the electrode plate, and a method of manufacturing the electrode plate.

BACKGROUND

Microfluidic control refers to the design and development of micro-nano channel fluid devices with biomimetic structure inspired by biological structure and functional principles. It is an emerging interdisciplinary subject that involves many subject fields such as materials science, chemistry, physical chemistry, interface science, fluid mechanics, biotechnology and micro-nano processing technology, and will provide renew design ideas on breakthroughs in microfluidic technology bottlenecks and promotion of its practical application.

Digital microfluidic control is to change the wettability of a droplet on an insulating substrate by changing the voltage between the droplet and the substrate, that is, changing the contact angle to cause the droplet to deform and shift. The so-called wettability refers to a process where one fluid on a solid surface is replaced by another fluid. The liquid can spread on the solid surface, and the solid-liquid contact surface tends to expand, that is, the adhesive force of the liquid to the solid surface is greater than its cohesive force, namely wetting. If the liquid cannot spread on the solid surface, and the contact surface tends to shrink into a spherical shape, then it is non-wetting, which means that the adhesive force of the liquid to the solid surface is less than its cohesive force.

Digital microfluidic technology can integrate basic operation units, such as sample preparation, reaction, separation, and detection in biological, chemical, and medical analysis processes, into a micrometer-scale chip, and automatically complete the entire analysis process. Because it can reduce costs, and has the advantages of short detection time and high sensitivity, it has shown great prospects in the fields of biology, chemistry, medicine and so on. However, the upper electrode plate of the existing microfluidic chip is provided with a super-hydrophobic layer on its surface near the liquid channel, and the droplet inlet hole penetrates through the upper electrode plate. When the droplet contacts the hole section in the super-hydrophobic layer, the contact angle is relatively large, the surface tension of the droplet itself forms an acting force opposite to the direction of injection, and therefore the droplet is not easily injected into the liquid channel.

SUMMARY

According to an aspect of the present disclosure, there is provided an electrode plate comprising: a substrate, an electrode and a surface contact layer stacked in sequence, and a droplet inlet hole passing through the substrate, the electrode and the surface contact layer; wherein the surface contact layer comprises a super-hydrophobic region and a hydrophilic region, and the droplet inlet hole is disposed in the hydrophilic region.

In some embodiments, a transition region is provided between the hydrophilic region and the super-hydrophobic region, and the transition region is configured such that a maximum contact angle of a droplet with the transition region is greater than a maximum contact angle of the droplet with the hydrophilic region but less than a maximum contact angle of the droplet with the super-hydrophobic region.

In some embodiments, the transition region is configured such that the maximum contact angle of the droplet with the transition region gradually increases in a direction from the hydrophilic region to the super-hydrophobic region.

In some embodiments, the transition region comprises hydrophilic blocks and super-hydrophobic blocks arranged alternately.

In some embodiments, in the direction of the transition region from the hydrophilic region to the super-hydrophobic region, an area ratio of the hydrophilic blocks to the super-hydrophobic blocks per a unit area gradually decreases.

In some embodiments, both the hydrophilic blocks and the super-hydrophobic blocks are annular blocks arranged around the hydrophilic region, and the hydrophilic blocks and the super-hydrophobic blocks are alternately disposed from the hydrophilic region to the super-hydrophobic region.

In some embodiments, the transition region comprises an annular super-hydrophobic zone arranged around the hydrophilic region, and a plurality of hydrophilic blocks located in the annular super-hydrophobic zone.

In some embodiments, in the direction of the transition region from the hydrophilic region to the super-hydrophobic region, an area ratio of the hydrophilic blocks to the super-hydrophobic zone per a unit area gradually decreases.

In some embodiments, in the direction of the transition region from the hydrophilic region to the super-hydrophobic region, the area of the hydrophilic blocks gradually decreases.

In some embodiments, a shape of the hydrophilic block is a triangle, a circle or a diamond.

In some embodiments, the transition region is a region formed by a material with a hydrophilic property between the hydrophilic region and the super-hydrophobic region.

In some embodiments, the hydrophilic region is made of resin, or the super-hydrophobic region is made of polytetrafluoroethylene, or the substrate is a glass substrate, or the electrode is a conductive glass electrode.

According to another aspect of the present disclosure, there is provided a microfluidic chip, comprising: a first electrode plate formed by the abovementioned electrode plate, and a second electrode plate provided on a side of the first electrode plate close to the surface contact layer, wherein the first electrode plate is provided opposite to the second electrode plate and a liquid channel is formed between the first electrode plate and the second electrode plate.

According to yet another aspect of the present disclosure, there is provided a method of manufacturing an electrode plate, and the method comprises:

forming an electrode on a surface of the substrate;

forming a surface contact layer on a surface of the electrode away from the substrate, the surface contact layer comprising a super-hydrophobic region and a hydrophilic region; and opening a droplet inlet hole through the substrate, the electrode and the hydrophilic region.

In some embodiments, the step of forming a surface contact layer on a surface of the electrode away from the substrate further comprises:

forming a hydrophilic material layer on the surface of the electrode away from the substrate;

performing a patterning treatment on the hydrophilic material layer to form the hydrophilic region and hydrophilic blocks in the transition region;

forming a super-hydrophobic material layer on the electrode and the hydrophilic material layer;

performing a leveling treatment on the super-hydrophobic material layer such that, super-hydrophobic material is fully filled between any two adjacent ones of the hydrophilic blocks, and the super-hydrophobic material layer forms a flat surface;

performing a curing treatment on the super-hydrophobic material layer; and performing a peeling treatment on the super-hydrophobic material layer, to peel off portions of the super-hydrophobic material layer located above the hydrophilic region and the hydrophilic blocks of the transition region, and to cause the hydrophilic region, the transition region, and the super-hydrophobic region to form a flat surface for contact with a droplet.

In some embodiments, the step of forming a surface contact layer on a surface of the electrode away from the substrate further comprises:

coating a super-hydrophobic material layer on the surface of the electrode away from the substrate;

performing a curing treatment and a surface leveling treatment on the super-hydrophobic material layer;

coating a barrier layer on the super-hydrophobic material layer, performing a patterning treatment on the barrier layer to remove portions of the barrier layer corresponding to the hydrophilic region and hydrophilic blocks of the transition region, performing an exposure and development treatment on the super-hydrophobic material layer to remove portions of the super-hydrophobic material layer corresponding to the hydrophilic region and the hydrophilic blocks of the transition region so as to form grooves, but remain portions of the super-hydrophobic material layer blocked by the barrier layer, and performing a peeling treatment on the barrier layer; and coating a hydrophilic material layer on the super-hydrophobic material layer and the electrode, performing a leveling treatment on the hydrophilic material layer to fully fill hydrophilic material in the grooves between the super-hydrophobic blocks so that the hydrophilic material layer is formed with a flat surface, performing a peeling treatment on the hydrophilic material layer to peel off portions of the hydrophilic material layer located above the super-hydrophobic material layer but remain portions of the hydrophilic material layer in the grooves, so as to form the hydrophilic region and the hydrophilic blocks of the transition region, and to cause the hydrophilic region, the transition region, and the super-hydrophobic region to form a flat surface for contact with a droplet.

It should be understood that the foregoing general description and the following detailed description are only exemplary and illustrative, and are not intended to limit the present disclosure.

This section provides an overview of various implementations or examples of the technology described in the present disclosure, and is not a comprehensive disclosure of the full scope or all features of the disclosed technology.

BRIEF DESCRIPTION OF THE DRAWINGS

In order to more clearly explain the technical solutions of the embodiments of the present disclosure, the drawings of the embodiments will be briefly introduced below. Obviously, the drawings in the following description only relate to some embodiments of the present disclosure, rather than limiting the present disclosure.

DETAILED DESCRIPTION OF THE EMBODIMENTS

In order to make the objectives, technical solutions, and advantages of the embodiments of the present disclosure more clear, the technical solutions of the embodiments of the present disclosure will be described clearly and completely in conjunction with the drawings of the embodiments of the present disclosure. Obviously, the described embodiments are some of the embodiments of the present disclosure, but not all the embodiments. Based on the described embodiments of the present disclosure, all other embodiments obtained by those skilled in the art without creative labor fall within the protection scope of the present disclosure.

Unless otherwise defined, the technical or scientific terms used in the present disclosure shall have their usual meanings as understood by those skilled in the art to which this disclosure belongs. The words "first", "second" and similar words used in the present disclosure do not indicate any order, quantity or importance, but are only used to distinguish different components. The similar words such as "comprise" or "include" mean that the elements or objects appearing before the word cover the elements or objects listed after the word and their equivalents, but do not exclude other elements or objects.

In order to keep the following description of the embodiments of the present disclosure clear and concise, the present disclosure omits detailed descriptions of known functions and known components.

Figure 1:
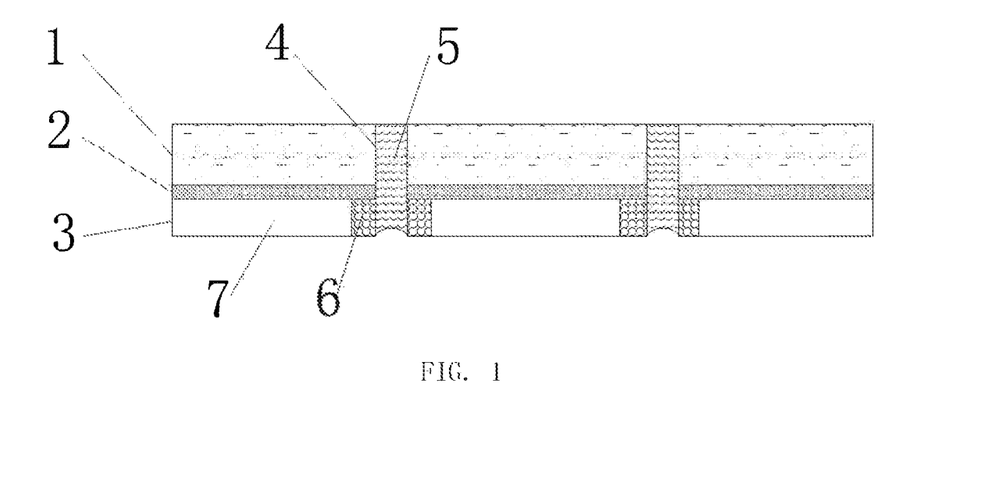
FIG. 1 is a schematic cross-sectional structure diagram showing an embodiment of an electrode plate according to the present disclosure.
Figure 2:
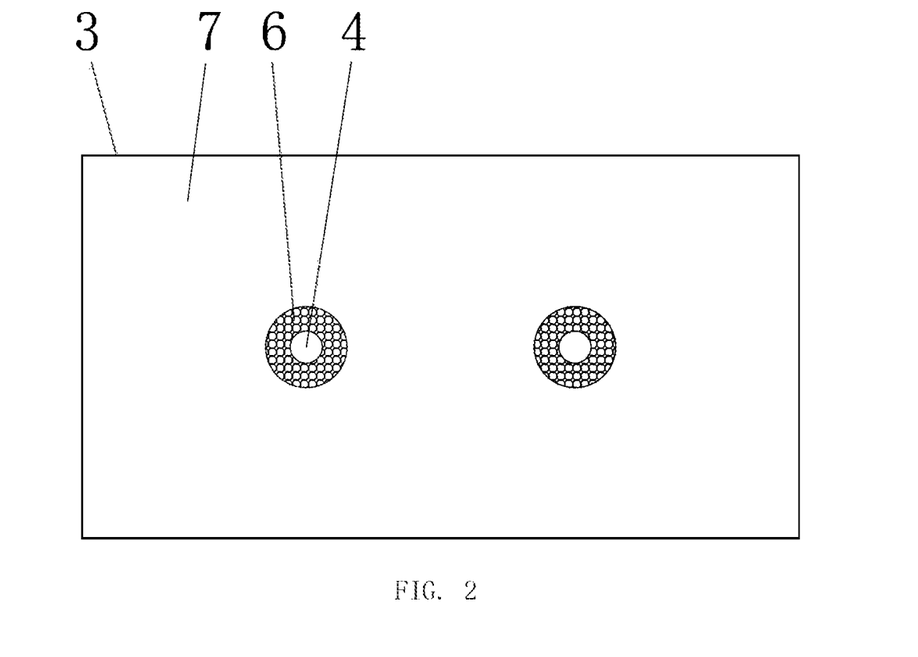
FIG. 2 is a schematic top view structure diagram showing the embodiment of the electrode plate according to the present disclosure.

FIG. 1 is a schematic cross-sectional structure diagram showing an embodiment of an electrode plate according to the present disclosure; FIG. 2 is a schematic top view cross-sectional structure diagram showing the embodiment of the electrode plate according to the present disclosure. Referring to FIG. 1 and FIG. 2, the electrode plate according to embodiments of the present disclosure comprises: a substrate 1, an electrode 2 and a surface contact layer 3 stacked in sequence, and a droplet inlet hole 4 passing through the substrate 1, the electrode 2 and the surface contact layer 4. The substrate 1 may use, for example, a glass substrate; the electrode 2 may use, for example, a conductive glass electrode or a metal electrode. The surface contact layer 3 comprises a super-hydrophobic region 7 and a hydrophilic region 6, and the droplet inlet hole 4 is disposed in the hydrophilic region 6.

The electrode plate according to embodiments of the present disclosure is mainly used to form a microfluidic chip with another electrode plate. There is a liquid channel between two electrode plates of the formed microfluidic chip, and the surface contact layer 3 is located on the side near the liquid channel. According to embodiments of the present disclosure, the droplet inlet hole 4 in the electrode plate is used to inject liquid into the liquid channel. Since the droplet inlet hole 4 is disposed and opened in the hydrophilic region 6, the contact angle of a droplet 5 with the hole wall in the hole section of the hydrophilic region 6 is relatively small. The surface tension of the droplet 5 itself is directed toward the injection direction of the droplet 5, which can assist in driving the droplet 5 into the liquid channel, thus the droplet 5 is more easily injected into the liquid channel. It overcomes the problems in the prior art that, the contact angle of the droplet 5 with the hole wall of the droplet inlet hole 4 in the super-hydrophobic layer is relatively large, in that case, the surface tension of the droplet 5 itself is directed toward the reverse of the injection direction, resulting in that droplet 5 is not easy to be injected.

Specifically, the super-hydrophobic region 7 may use polytetrafluoroethylene material, and the hydrophilic region 6 may use Resin material, such as polyamide resin, phenol resin or other types of resin. When the droplet is 2 uL-18 uL and the hydrophilic region 6 of resin material is used, the contact angle of the droplet 5 with the hole wall of the droplet inlet hole 4 is about 84°, and the surface tension is directed toward the injection direction of the droplet 5, and the droplet can be injected smoothly into the liquid channel.

In order to enable the droplet 5 passing through the droplet inlet hole 4 to smoothly transit from the hydrophilic region 6 to the super-hydrophobic region 7, a transition region 8 can also be provided between the hydrophilic region 6 and the super-hydrophobic region 7. The maximum contact angle of the droplet 5 with the transition region 8 is greater than the maximum contact angle of the droplet 5 with the hydrophilic region 6 and less than the maximum contact angle of the droplet 5 with the super-hydrophobic region 7. In this way, the contact angle of the droplet 5 with the surface contact layer 3 gradually increases during the process of the droplet 5 from the hydrophilic region 6 to the transition region 8 and then to the super-hydrophobic region 7, which can prevent the droplet 5 from gathering at the hydrophilic region 6. It should be noted that the fact that the contact angle of the droplet 5 with the surface contact layer 3 gradually increases refers to the same droplet 5.

Further, the transition region 8 may also be configured such that as the distance of the transition region 8 from the hydrophilic region 6 increases, the maximum contact angle of the droplet 5 with the transition region 8 gradually increases. In this way, in the place of the transition region 8 close to the hydrophilic region 6, the area of the hydrophilic blocks 9 in the unit area accounts for a large proportion of the total area of the unit area, and the contact angle of the droplet 5 with the transition region 8 is still large, and the droplet 5 can transit smoothly from the hydrophilic region 6 to the transition region 8; with the increase of the distance from the hydrophilic region 6, the area ratio of the hydrophilic blocks 9 to the super-hydrophobic blocks 10 in the unit area gradually decreases, and when the droplet 5 moves toward the super-hydrophobic region 7 in the transition region 8, the contact angle of the droplet 5 with the transition region 8 also gradually increases, until at the place of the transition region 8 close to the super-hydrophobic region 7, the contact angle of the droplet 5 with the transition region 8 gets close to the contact angle of the droplet 5 with the super-hydrophobic region 7, and then the droplet 5 can smoothly transit to the super-hydrophobic region 7.

There are many ways to form the transition region 8. In one embodiment, the transition region 8 may include hydrophilic blocks 9 and super-hydrophobic blocks 10 arranged alternately. After the droplet 5 moves to the transition region 8, it can be in contact with the hydrophilic blocks 9 and super-hydrophobic blocks 10 at the same time, so the maximum contact angle of the droplet 5 with the surface contact layer 3 is affected by both hydrophilic blocks 9 and super-hydrophobic blocks 10, that is, it is greater than the maximum contact angle of the droplet 5 with the hydrophilic region 6 and less than the maximum contact angle of the droplet 5 with the super-hydrophobic region 7.

Further, the transition region 8 may also be configured such that, as the distance from the hydrophilic region 6 increases, the area ratio of the hydrophilic blocks 9 to the super-hydrophobic blocks 10 in the unit area of the transition region 8 gradually decreases. That is, as the distance from the hydrophilic region 6 increases, the area ratio of the hydrophilic blocks 9 to the whole unit area gradually decreases, while the area ratio of the super-hydrophobic blocks 10 to the whole unit area gradually increases. As the distance from the hydrophilic region 6 increases, the contact area of the droplet 5 with the super-hydrophobic blocks 10 also gradually increases, while the contact area of the droplet 5 with the hydrophilic blocks 9 gradually decreases. The influence of the super-hydrophobic blocks 10 is getting larger, and the influence of the hydrophilic blocks 9 is getting smaller, which achieves the purpose of gradually increasing the contact angle of the droplet 5 with the transition zone 8 when the droplet 5 moves from the place close to the hydrophilic region 6 to the place close to the super-hydrophobic region 7.

Furthermore, both the hydrophilic blocks 9 and the super-hydrophobic blocks 10 can be annular blocks arranged around the hydrophilic region 6, and the hydrophilic blocks 9 and the super-hydrophobic blocks 10 are alternately disposed from the hydrophilic region 6 to the super-hydrophobic region 7. As the distance from the hydrophilic region 6 increases, the width of the hydrophilic blocks 9 can gradually decrease, or the width of the super-hydrophobic blocks 10 can gradually increase, or the width of the super-hydrophobic blocks 10 can gradually increase while the width of the hydrophilic blocks 9 gradually decreases, so that the area ratio of hydrophilic blocks 9 to super-hydrophobic blocks 10 in the unit area gradually decreases.

Figure 3:
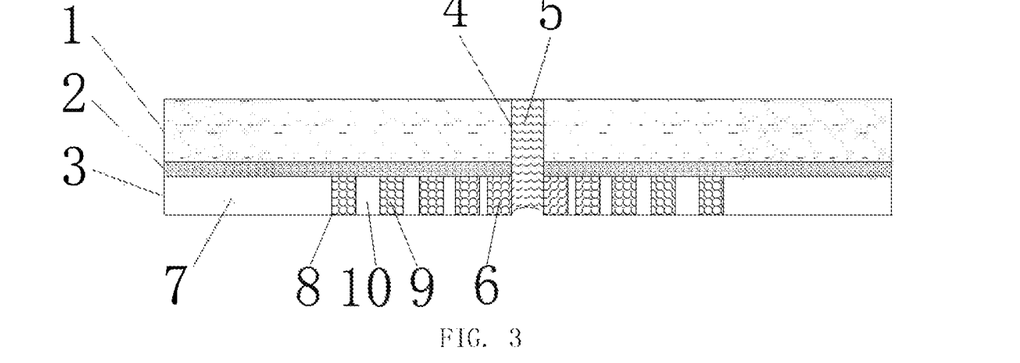
FIG. 3 is a schematic cross-sectional structure diagram showing another embodiment of the electrode plate according to the present disclosure.

For example, as shown in FIG. 3, the hydrophilic region 6 may be a circular region formed by a resin material, the droplet inlet hole 4 is opened in the middle of the circular region, and the transition region 8 is disposed outside the hydrophilic region 6, the rest region of the surface contact layer 3 is the super-hydrophobic region 7. The transition region 8 is composed of annular hydrophilic blocks 9 and annular super-hydrophobic blocks 10 spaced from each other. As the distance from the hydrophilic region 6 increases, the width of the annular hydrophilic blocks 9 is unchanged, while the width of the annular super-hydrophobic blocks 10 gradually increases, and the interval between two adjacent hydrophilic blocks 9 gradually increases, thereby achieving the purpose of gradually decreasing the area ratio of the hydrophilic blocks 9 to the super-hydrophobic blocks 10 in a unit area. Of course, it is also possible to gradually decrease the area ratio of the hydrophilic blocks 9 to the super-hydrophobic blocks 10 in the unit area by gradually decreasing the width of the annular hydrophilic blocks 9, or by gradually increasing the width of the annular super-hydrophobic blocks 10 while gradually decreasing the width of the annular hydrophilic blocks 9. It should be noted that the shapes of the hydrophilic blocks 9 and the super-hydrophobic blocks 10 are not limited to the annular shape, but may also be the blocks of other regular shapes or irregular shapes arranged alternately.

In another embodiment, the transition region 8 comprises a super-hydrophobic zone 11 arranged around the hydrophilic region 6, and a plurality of hydrophilic blocks 9 located in the annular super-hydrophobic zone 9. The droplet 5 can be in contact with both the hydrophilic blocks 9 and the super-hydrophobic zone 11 at the same time, and the maximum contact angle of the droplet 5 with transition region 8 is affected by both the hydrophilic blocks 9 and the super-hydrophobic zone 11, which is greater than the maximum contact angle of the droplet 5 with the hydrophilic region 6 but is smaller than the maximum contact angle of the droplet 5 with the super-hydrophobic region 7.

Further, the transition region 8 may also be configured such that, as the distance from the hydrophilic region 6 increases, the area ratio of the hydrophilic blocks 9 to the super-hydrophobic zone 11 in the unit area of the transition region 8 gradually decreases, which achieves the purpose of gradually increasing the contact angle of the droplet 5 with the transition zone 8 when the droplet 5 moves from the place close to the hydrophilic region 6 to the place close to the super-hydrophobic region 7. The area ratio of the hydrophilic blocks 9 to the super-hydrophobic zone 11 in the unit area of the transition region 8 gradually decreases, which can be achieved by gradually decreasing the areas of various single hydrophilic blocks 9 as the distance from the hydrophilic region 6 increases, or by gradually reducing the number of hydrophilic blocks 9 in the unit area.

Figure 4:
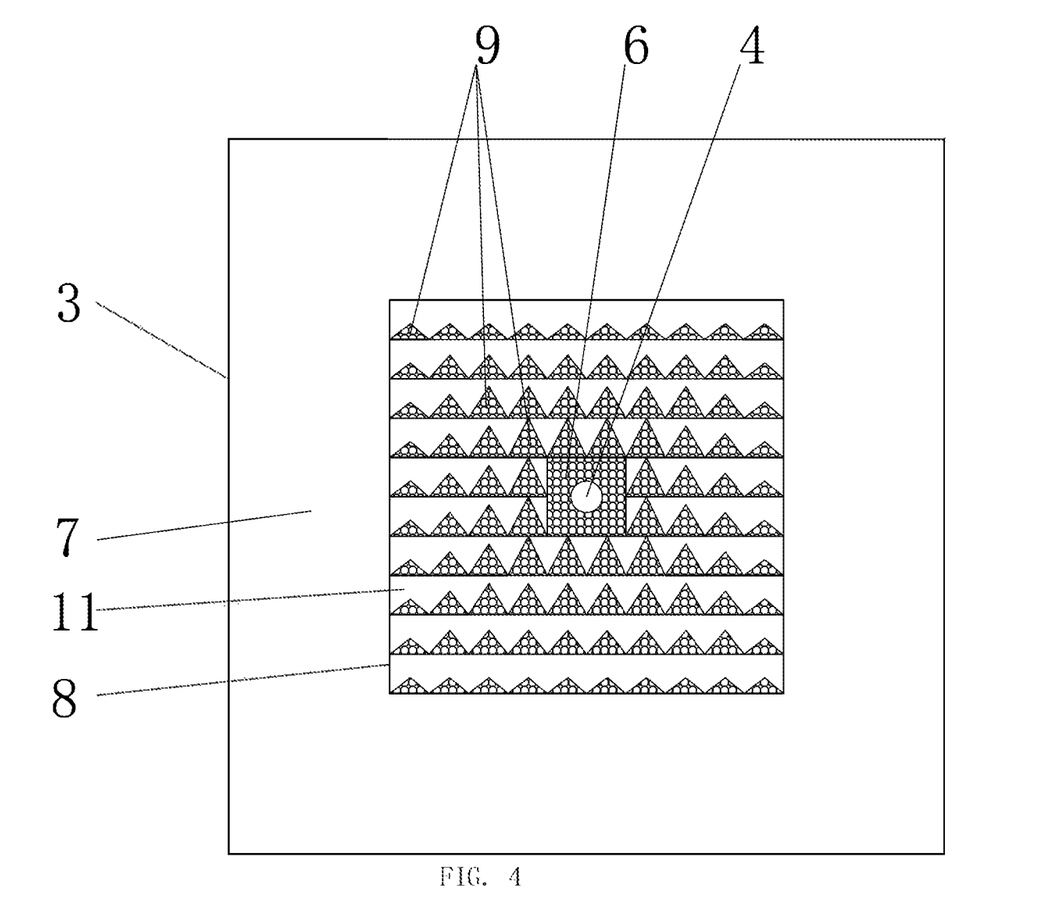
FIG. 4 is a schematic top view structure diagram showing yet another embodiment of the electrode plate according to the present disclosure.
Figure 5A:
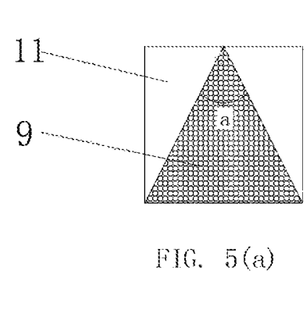
FIG. 5(a) to FIG. 5(c) are respectively schematic partial structure diagrams showing hydrophilic blocks with different shapes in still another embodiment of the electrode plate according to the present disclosure.

For example, as shown in FIG. 4, the hydrophilic region 6 may be a rectangular region formed by a resin material, the droplet inlet hole 4 is opened in the middle of the rectangular region, and the transition region 8 is a rectangular ring-shaped region disposed outside the rectangular hydrophilic region 6, the rest region of the surface contact layer 3 is the super-hydrophobic region 7. The super-hydrophobic zone 11 is a rectangular ring-shaped super-hydrophobic zone 11, and the hydrophilic blocks 9 are of an isosceles triangle. The hydrophilic blocks 9 are located in the super-hydrophobic region 7 in a horizontal and vertical arrangement. As the distance from the hydrophilic region 6 increases, the hydrophilic blocks 9 of isosceles triangle shape gradually reduces their areas by unchanging the length of the bottom edge and gradually decreasing the length of the two waist edges (i.e., by gradually increasing the angle value of the angle a), as shown in FIG. 5 (a) as shown.

Figure 5B:
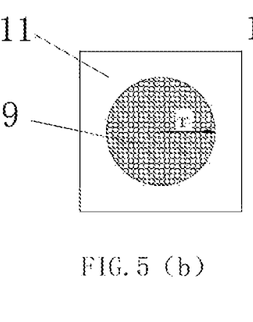
Figure 5C:
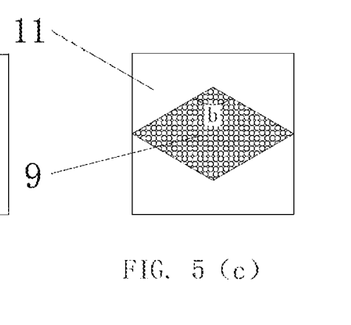

As shown in FIG. 4 and FIG. 5 (b) or FIG. 5 (c), the hydrophilic block 9 may also be of a circle or a diamond. As shown in FIG. 5 (b), when the hydrophilic blocks 9 are of a circle, the areas can be gradually decreased by gradually decreasing the radius r of the circle. As shown in FIG. 5 (c), when the hydrophilic blocks are of a diamond, the areas can be gradually decreased by unchanging the length of one diagonal line and gradually decreasing the length of another diagonal line (that is, by gradually increasing the angle value of the angle b).

When the area ratio of the hydrophilic blocks 9 to the super-hydrophobic zone 11 in the unit area gradually decreases, that is, when the ratio of the area of the super-hydrophobic zone 11 in the unit area to the total area of the unit area gradually increases, The change of the maximum contact angle of the droplet 5 with the transition region 8 is shown in TABLE 1, where f1 is the ratio of the area of the super-hydrophobic zone 11 in the unit area to the total area of the unit area, and CA is the maximum contact angle of the droplet 5 with the transition region 8. TABLE 1 exemplarily shows the maximum contact angles of the droplet 5 with the transition region 8 when the hydrophilic blocks 9 are of a triangle, a circle and a diamond.

TABLE 1

| triangle | | diamond | | circle | |
|---|---|---|---|---|---|
| f1 | CA(°) | f1 | CA(°) | f1 | CA(°) |
| 0.37 | 125 | 0.37 | 125 | 0.30 | 122 |
| 0.57 | 135 | 0.57 | 136 | 0.57 | 136 |
| 0.75 | 145 | 0.65 | 140 | 0.65 | 141 |
| 0.85 | 155 | 0.80 | 150 | 0.85 | 155 |
| 0.95 | 165 | 0.95 | 165 | 0.95 | 165 |

As shown in TABLE 1, taking the hydrophilic blocks 9 of a triangle as an example, when the ratio of the area of the super-hydrophobic zone 11 to the total area of the unit area is 0.37, that is, when the super-hydrophobic zone 11 accounts for 37% of the total area of the unit area, the maximum contact angle of the droplet 5 with the transition region 8 is 125°. As the ratio of the area of the super-hydrophobic zone 11 to the total area of the unit area gradually increases, the maximum contact angle of the droplet 5 with the transition region 8 increases gradually. When the ratio of the area of the super-hydrophobic zone 11 to the total area of the unit area reaches 0.95, the maximum contact angle of the droplet 5 with the transition region 8 reaches 165°. In this way, by providing the transition region 8 between the hydrophilic region 6 and the super-hydrophobic region 7, the droplet 5 can be smoothly moved to the super-hydrophobic region 7 from the hydrophilic region 6, and the contact angle of the droplet 5 gradually changes during the movement.

It should be noted that the transition region 8 is not limited to the above structure, for example, it may also be a region formed by a material having a hydrophilicity between the hydrophilic region 6 and the super-hydrophobic region 7.

Figure 6:
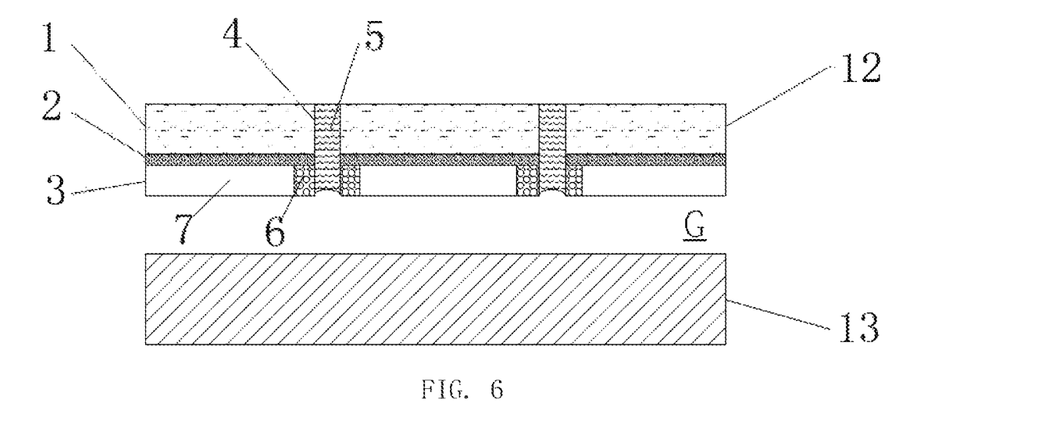
FIG. 6 is a schematic cross-sectional structure diagram showing a microfluidic chip according to the present disclosure.

FIG. 6 is a schematic structure diagram showing a microfluidic chip according to embodiments of the present disclosure. Referring to FIG. 6, the microfluidic chip according to embodiments of the present disclosure comprises: a first electrode plate 12 formed by the abovementioned electrode plate, and a second electrode plate 13 provided on a side of the first electrode plate 12 close to the surface contact layer 3. The first electrode plate 12 and the second electrode plate 13 are provided opposite to each other and a liquid channel G is formed therebetween.

Since the contact angle of the droplet 5 with the hole wall of the droplet inlet hole 4 of the abovementioned electrode plate is small, the surface tension of the droplet 5 itself forms an auxiliary driving force toward the injection direction, which can assist the droplet 5 in moving toward the super-hydrophobic layer and make it easier for the droplet 5 to be injected into the liquid channel. Therefore, the microfluidic chip applied with the abovementioned electrode plate also has the advantage of easy liquid injection.

Figure 7:
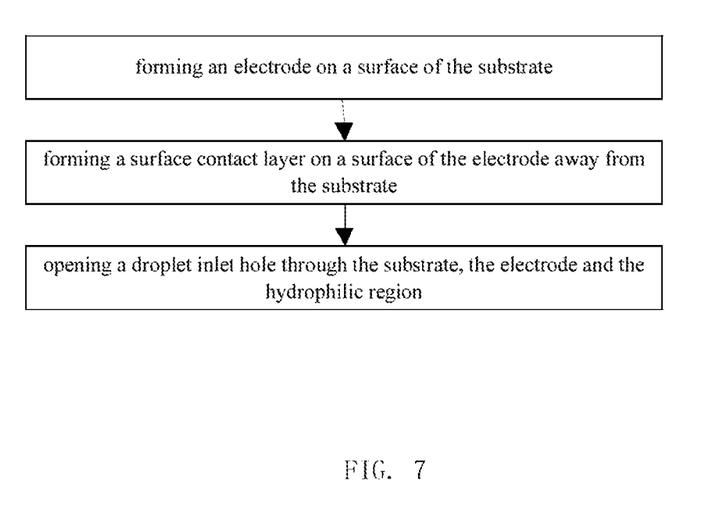
FIG. 7 is a flow diagram showing a method of manufacturing the electrode plate according to the present disclosure.

Referring to FIG. 7, embodiments of the present disclosure also provide a method of manufacturing the abovementioned electrode plate. It specifically comprises the following steps.

Step 1 is to form an electrode 2 on a surface of the substrate 1.

The substrate 1 may be a glass substrate, and the electrode 2 may be an ITO electrode.

Specifically, it can be achieved by the following steps. A layer of ITO conductive film is coated on a surface of the substrate 1. The thickness of the conductive film may be 400 angstroms to 800 angstroms. In this embodiment, the conductive film is set to be 700 angstroms. Under a nitrogen atmosphere, an annealing treatment is performed to crystallize the conductive film. The annealing temperature can be 230° C. and the annealing time can be 60 minutes. The conductive film can also be formed by a process such as magnetron sputtering.

Step 2 is to form a surface contact layer 3 on a surface of the electrode 2 away from the substrate 1, wherein the surface contact layer 3 comprises a super-hydrophobic region 7 and a hydrophilic region 6.

In one embodiment, the step 2 may comprise the followings.

A hydrophilic material layer is formed on the surface of the electrode 2 away from the substrate 1. The hydrophilic material layer can be, for example, a resin layer, and the resin layer can be formed on the electrode 2 by a coating process.

A patterning treatment is performed on the hydrophilic material layer to form the hydrophilic region 6 and hydrophilic blocks in the transition region 8. For performing the patterning treatment on the hydrophilic material layer, for example, a half-tone gray-scale exposure process may be used.

A super-hydrophobic material layer is formed on the electrode 2 and the hydrophilic material layer. The super-hydrophobic material may be polytetrafluoroethylene, and a polytetrafluoroethylene emulsion may be coated on the electrode 2 and the hydrophilic material layer by a coating process.

A leveling treatment is performed on the coated super-hydrophobic material layer such that, super-hydrophobic material is fully filled between any two adjacent ones of the hydrophilic blocks 9, and the super-hydrophobic material layer forms a flat surface.

A curing treatment is performed on the super-hydrophobic material layer. The curing temperature may be 230° C., and the curing time may be 60 minutes. The temperature and time of the curing process are not limited to the above values, but can be adjusted according to actual needs.

A peeling treatment is performed on the super-hydrophobic material layer, to peel off portions of the super-hydrophobic material layer located above the hydrophilic region 6 and the hydrophilic blocks 9 of the transition region 8, and to cause the hydrophilic region 6, the transition region 8, and the super-hydrophobic region 7 to form a flat surface for contact with a droplet 5. In this step, the peeling treatment can use an ashing process.

In another embodiment, the step 2 may also comprise the followings.

A super-hydrophobic material layer is coated on the surface of the electrode 2 away from the substrate 1. The super-hydrophobic material layer can be a polytetrafluoroethylene layer. After the super-hydrophobic material layer is cured, a surface leveling treatment is performed on the super-hydrophobic material layer by, for example, a plasma treatment process.

A barrier layer is coated on the super-hydrophobic material layer. The barrier layer may use plastic rubber material. A patterning treatment is performed on the barrier layer to remove portions of the barrier layer corresponding to the hydrophilic region 6 and hydrophilic blocks 9 of the transition region 8. Exposure and development treatment is performed on the super-hydrophobic material layer to remove portions of the super-hydrophobic material layer corresponding to the hydrophilic region 6 and the hydrophilic blocks 9 in the transition region 8 so as to form grooves, but remain portions of the super-hydrophobic material layer blocked by the barrier layer. Then, a peeling treatment is performed on the barrier layer.

A hydrophilic material layer is coated on the super-hydrophobic material layer and the electrode 2. A leveling treatment is performed on the hydrophilic material layer to fully fill hydrophilic material in the grooves between the super-hydrophobic blocks 10 so that the hydrophilic material layer is formed with a flat surface. A peeling treatment is performed on the hydrophilic material layer to peel off portions of the hydrophilic material layer located above the super-hydrophobic material layer but remain portions of the hydrophilic material layer in the grooves, so as to form the hydrophilic region 6 and the hydrophilic blocks 9 of the transition region 8, and to cause the hydrophilic region 6, the transition region 8, and the super-hydrophobic region 7 to form a flat surface for contact with a droplet 5.

Step 3 is to open a droplet inlet hole 4 through the substrate 1, the electrode 2 and the hydrophilic region 6.

Specifically, the step 3 can be achieved by the following steps.

A mask layer is provided on the surface of the super-hydrophobic layer, and a patterning treatment is performed on the mask layer to remove a part of the mask layer corresponding to the droplet inlet hole 4. The droplet inlet hole 4 is opened in the substrate 1, the electrode 2 and the hydrophilic region 6 by performing an etching treatment. A peeling treatment is performed to the mask layer.

The above embodiments are only exemplary embodiments of the present disclosure, and are not used to limit the present disclosure, and the protection scope of the present disclosure is defined by the claims. Those skilled in the art may make various modifications or equivalent replacements to the present disclosure within the essence and protection scope of present disclosure, and such modifications or equivalent replacements shall also be deemed to fall within the protection scope of present disclosure.

What is claimed is:

1. An electrode plate comprising: a substrate, an electrode and a surface contact layer stacked in sequence, and a droplet inlet hole passing through the substrate, the electrode and the surface contact layer; wherein the surface contact layer comprises a super-hydrophobic region and a hydrophilic region, and the droplet inlet hole is disposed in the hydrophilic region, wherein a transition region is provided between the hydrophilic region and the super-hydrophobic region, and the transition region is configured such that a maximum contact angle of a droplet with the transition region is greater than a maximum contact angle of the droplet with the hydrophilic region but less than a maximum contact angle of the droplet with the super-hydrophobic region;

the transition region is configured such that the maximum contact angle of the droplet with the transition region gradually increases in a direction from the hydrophilic region to the super-hydrophobic region;

the transition region comprises hydrophilic blocks and super-hydrophobic blocks arranged alternately;

in the direction from the hydrophilic region to the super-hydrophobic region, an area ratio of the hydrophilic blocks to the super-hydrophobic blocks in the transition region per a unit area gradually decreases; and both the hydrophilic blocks and the super-hydrophobic blocks are annular blocks arranged around the hydrophilic region, and the hydrophilic blocks and the super-hydrophobic blocks are alternately disposed from the hydrophilic region to the super-hydrophobic region.

2. The electrode plate of claim 1, wherein the transition region comprises an annular super-hydrophobic zone arranged around the hydrophilic region, and a plurality of hydrophilic blocks located in the annular super-hydrophobic zone.

3. The electrode plate of claim 2, wherein in the direction from the hydrophilic region to the super-hydrophobic region, an area ratio of the hydrophilic blocks to the super-hydrophobic zone in the transition region per a unit area gradually decreases.

4. The electrode plate of claim 3, wherein, in the direction from the hydrophilic region to the super-hydrophobic region, the area of the hydrophilic blocks in the transition region gradually decreases.

5. The electrode plate of claim 4, wherein, a shape of the hydrophilic block is a triangle, a circle or a diamond.

6. The electrode plate of claim 1, wherein the transition region is a region formed by a material with a hydrophilic property between the hydrophilic region and the super-hydrophobic region.

7. The electrode plate of claim 1, wherein the hydrophilic region is made of resin, and the super-hydrophobic region is made of polytetrafluoroethylene.

8. The electrode plate of claim 1, wherein the substrate is a glass substrate, and the electrode is a conductive glass electrode.

9. A microfluidic chip, comprising: a first electrode plate formed by the electrode plate of claim 1, and a second electrode plate provided on a side of the first electrode plate close to the surface contact layer, wherein the first electrode plate is provided opposite to the second electrode plate and a liquid channel is formed between the first electrode plate and the second electrode plate.

10. A method of manufacturing an electrode plate, comprising:

forming an electrode on a surface of the substrate;

forming a surface contact layer on a surface of the electrode away from the substrate, the surface contact layer comprising a super-hydrophobic region and a hydrophilic region; and opening a droplet inlet hole through the substrate, the electrode and the hydrophilic region, wherein a transition region is provided between the hydrophilic region and the super-hydrophobic region, and the transition region is configured such that a maximum contact angle of a droplet with the transition region is greater than a maximum contact angle of the droplet with the hydrophilic region but less than a maximum contact angle of the droplet with the super-hydrophobic region;

the transition region is configured such that the maximum contact angle of the droplet with the transition region gradually increases in a direction from the hydrophilic region to the super-hydrophobic region;

the transition region comprises hydrophilic blocks and super-hydrophobic blocks arranged alternately;

in the direction from the hydrophilic region to the super-hydrophobic region, an area ratio of the hydrophilic blocks to the super-hydrophobic blocks in the transition region per a unit area gradually decreases; and both the hydrophilic blocks and the super-hydrophobic blocks are annular blocks arranged around the hydrophilic region, and the hydrophilic blocks and the super-hydrophobic blocks are alternately disposed from the hydrophilic region to the super-hydrophobic region.

11. The method of claim 10, wherein the step of forming a surface contact layer on a surface of the electrode away from the substrate further comprises:

forming a hydrophilic material layer on the surface of the electrode away from the substrate;

performing a patterning treatment on the hydrophilic material layer to form the hydrophilic region and the hydrophilic blocks in the transition region;

forming a super-hydrophobic material layer on the electrode and the hydrophilic material layer;

performing a leveling treatment on the super-hydrophobic material layer such that, super-hydrophobic material is fully filled between any two adjacent ones of the hydrophilic blocks, and the super-hydrophobic material layer forms a flat surface;

performing a curing treatment on the super-hydrophobic material layer; and performing a peeling treatment on the super-hydrophobic material layer, to peel off portions of the super-hydrophobic material layer located above the hydrophilic region and the hydrophilic blocks of the transition region, and to cause the hydrophilic region, the transition region, and the super-hydrophobic region to form a flat surface for contact with a droplet.

12. The method of claim 10, wherein the step of forming a surface contact layer on a surface of the electrode away from the substrate further comprises:

coating a super-hydrophobic material layer on the surface of the electrode away from the substrate;

performing a curing treatment and a surface leveling treatment on the super-hydrophobic material layer;

coating a barrier layer on the super-hydrophobic material layer, performing a patterning treatment on the barrier layer to remove portions of the barrier layer corresponding to the hydrophilic region and hydrophilic blocks of the transition region, performing an exposure and development treatment on the super-hydrophobic material layer to remove portions of the super-hydrophobic material layer corresponding to the hydrophilic region and the hydrophilic blocks of the transition region so as to form grooves, but remain portions of the super-hydrophobic material layer blocked by the barrier layer, and performing a peeling treatment on the barrier layer; and coating a hydrophilic material layer on the super-hydrophobic material layer and the electrode, performing a leveling treatment on the hydrophilic material layer to fully fill hydrophilic material in the grooves between the super-hydrophobic blocks so that the hydrophilic material layer is formed with a flat surface, performing a peeling treatment on the hydrophilic material layer to peel off portions of the hydrophilic material layer located above the super-hydrophobic material layer but remain portions of the hydrophilic material layer in the grooves, so as to form the hydrophilic region and the hydrophilic blocks of the transition region, and to cause the hydrophilic region, the transition region, and the super-hydrophobic region to form a flat surface for contact with a droplet.

* * * * *